United States Patent [19]

Tokunaga

[11] Patent Number: 5,690,736
[45] Date of Patent: Nov. 25, 1997

[54] METHOD OF FORMING CRYSTAL

[75] Inventor: Hiroyuki Tokunaga, Kawasaki, Japan

[73] Assignee: Canon Kabushiki Kaisha, Tokyo, Japan

[21] Appl. No.: 594,474

[22] Filed: Jan. 31, 1996

Related U.S. Application Data

[63] Continuation of Ser. No. 222,367, Apr. 4, 1994, abandoned, which is a continuation of Ser. No. 14,002, Feb. 5, 1993, abandoned, which is a continuation of Ser. No. 689,104, Apr. 23, 1991, abandoned, which is a continuation of Ser. No. 234,750, Aug. 22, 1988, abandoned.

[30] Foreign Application Priority Data

Aug. 24, 1987 [JP] Japan ................... 62-209461

[51] Int. Cl.$^6$ .................................... C30B 25/04
[52] U.S. Cl. ................... 117/86; 117/94; 117/95; 117/90; 117/100; 117/105; 117/935; 437/238; 437/241
[58] Field of Search ............... 437/238, 241; 427/233.1; 117/935, 94, 86, 95, 100, 105, 90

[56] References Cited

U.S. PATENT DOCUMENTS

| | | | |
|---|---|---|---|
| 3,372,069 | 3/1968 | Bailey et al. | 156/613 |
| 3,490,961 | 1/1970 | Frieser et al. | 156/613 |
| 3,508,962 | 4/1970 | Manasevit et al. | 156/613 |
| 3,620,833 | 11/1971 | Gleim et al. | 156/614 |
| 4,000,020 | 12/1976 | Gartman | 156/610 |
| 4,371,421 | 2/1983 | Fan et al. | 156/624 |
| 4,497,683 | 2/1985 | Celler et al. | 156/613 |
| 4,522,662 | 6/1985 | Bradbury et al. | 156/613 |

FOREIGN PATENT DOCUMENTS

| | | | |
|---|---|---|---|
| 53-58978 | 5/1978 | Japan | 156/613 |
| 59-83998 | 5/1984 | Japan | 156/613 |
| 1358438 | 7/1974 | United Kingdom | 156/610 |

OTHER PUBLICATIONS

Bloem, J. et al., "Nucleation and growth of silicon films by chemical vapour deposition," 8062 Philips Technical Review, vol. 41, pp. 60–69 (1983/84).

Sze, S.M., "Semiconductor Devices Physics and Technology," pp. 354–357, AT&T Bell Laboratories (1985).

Jastrzebski, "SCI by CVD: Epitaxial Lateral Over Growth (ELO) Process—Review", Journal of Crystal Growth, vol. 63 (1983) pp. 493–526.

Jastrzebski et al, Growth Process of Silicon Over SiO$_2$, by CVD: Epitaxial Lateral Overgrowth . . . , J. Electrochem Soc. Solid–State Sci. and Tech, Jul. 83, 1571–1580.

Claassen et al., The Nucleation of CVD Silicon on SiO$_2$ and Si$_3$N$_4$ Substrates, J. Electrochem. Soc., Solid–State Sci. and Tech., vol. 127, No. 1, Jan. 1980, pp. 194–202.

*Primary Examiner*—Robert Kunemund
*Attorney, Agent, or Firm*—Fitzpatrick, Cella, Harper & Scinto

[57] ABSTRACT

A crystal is formed by applying crystal forming treatment to a substrate, the surface of the substrate being divided into nonnucleation surface exhibiting a small nucleation density and nucleation surface having a sufficeintly small area to allow crystal growth from a single nucleus and exhibiting a larger nucleation density than the nonnucleation surface and the nonnucleation surface being constituted of the surface of a buffer layer to alleviate generation of stress in the crystal formed.

11 Claims, 4 Drawing Sheets

METHOD OF FORMING CRYSTAL

This application is a continuation of application Ser. No. 08/222,367 filed Apr. 4, 1994, now abandoned, which is a continuation of Application Ser. No. 08/014,002 filed Feb. 5, 1993, now abandoned, which is a continuation of application Ser. No. 07/689,104 filed Apr. 23, 1991, now abandoned, which is a continuation of Application Ser. No. 07/234,750 filed Aug. 22, 1988, now abandoned.

BACKGROUND OF THE INVENTION

1. Field of the Invention

The present invention relates to a method of forming a crystal, particularly a method of forming a crystal utilizing the difference in nucleation density of a material to be deposited depending on the kinds of deposition surface materials.

The present invention is applied, for example, to formation of crystals including monocrystal, polycrystal, etc, used for electronic devices optical devices, magnetic devices, piezoelectric devices, surface acoustic devices, etc. of semiconductor integrated circuits, optical integrated circuit, magnetic circuits, etc.

2. Related Background Art

There are described experimental results with regard to the selectivity of crystal formation on various substrate materials in Claassen et al, J. Electrochem. Soc., Vol. 127, No. 1, 194–202 (January 1980).

In the above paper, Claassen et al experimentally confirm that the selective silicon crystal formation on substrates can be performed, by preparing two kinds of substrates, one having a surface constituted of a material facilitating the deposition film formation thereon ($Si_3N_4$) and the other having a surface constituted of a material preventing the easy formation of a deposition film thereon ($SiO_2$). Claassen et al may suggest that the selectivity of crystal formation described in the above paper can be utilized for selective formation of a crystalline deposited film on any substrate. However, Claassen et al give no teachings as to a method for forming a monocrystal at a desired position on the surface of a given substrate. Also, Claassen et al give no teachings as to formation of a polycrystal having a precisely controlled crystal grain size.

On the other hand, a method for forming a polycrystal by forming individual monocrystal grains with a desirably controlled grain size at desired positions on a substrate is described in European Patent Application No. 0244081 in the name of the present assignee.

The above method is illustrated, for example, in FIGS. 1A–1D. A substrate having a support 101 and a nonnucleation surface 102 formed thereon constituted of a material preventing easy formation of a crystal nucleus with nucleation surfaces 103-1, 103-2 constituted of a material facilitating formation of a crystal nucleus and patterned to have a minor area (FIG. 1A) is subjected to a crystal growth treatment in vapor phase to allow monocrystals to grow on the nucleation surfaces 103-1, 103-2, thereby performing selective growth of crystal islands 104-1, 104-2 as individual monocrystal regions on the substrate (FIG. 1B). When a plurality of crystal islands grow to be brought into contact with each other and form grain boundaries 105, a polycrystalline film constituted of an aggregation of monocrystal grains controlled in grain size and arrangement is formed. This method has the particular advantage that since nucleus generation and monocrystal growth can occur only on the nucleation surfaces 103-1, 103-2, monocrystals with a desired size are formed at desired positions.

In the course of further investigation of the above method, the present inventor has found out the fact that crystal defects in the crystals may often occur at the proximity of the interface between crystals 104A-1, 104A-2 and the nonnucleation surface 102 in the stage of crystal lateral growth on the nonnucleation surface 102 (FIG. 1B→FIG. 1C).

Although the crystal defects in some cases stop within the part at the proximity of the interface, they may be developed to the upper part of crystals to thereby cause a wide variation of characteristics among the individual crystal islands. In case a large number of crystal islands grown on a substrate are utilized to form a large area active device, the above variation of characteristics among the individual crystal islands is a serious problem.

In other words, a crystal having a large number of crystal defects is inferior in electrical characteristics as compared to a crystal having no defect, and in case a large active device is formed by utilizing a large number of crystal islands, variation among devices is emphasized by the variation of characteristics among crystal islands due to crystal defects, thus lowering the reliability.

The present inventor, through intensive study, has developed a crystal forming method solving the above problem.

SUMMARY OF THE INVENTION

An object of the present invention is to provide a method of forming a crystal solving the currently recognized problem in the crystal forming technology as described above and suppressing the generation of crystal defect.

Another object of the present invention is to provide a method of forming a crystal utilizing the selective nucleation technique which utilizes the difference in nucleation density of a material to be deposited on two kinds of deposition surface materials to form monocrystal islands selectively on given positions on the deposition surface wherein said deposition surface is the surface of a buffer layer (second layer) so that the generation of stress at the interface is greatly suppressed as compared with a case employing substantially no constitutional feature of the present invention.

Still another object of the present invention is to provide a method of forming a monocrystal at a desired position on any kind of support with suppressing the generation of crystal defect.

Still another object of the present invention is to provide a method of forming a polycrystal controlled in grain size and the position of grain boundary with suppressing the generation of crystal defect.

DESCRIPTION OF THE PREFERRED EMBODIMENT

Figure 1A:
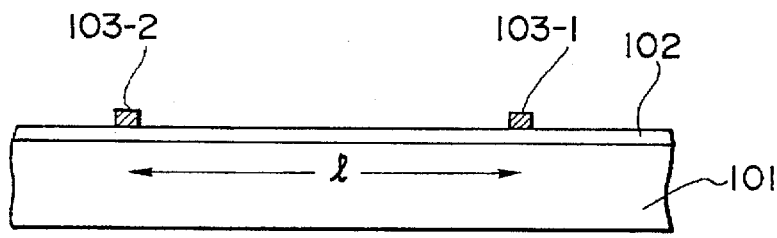
FIGS. 1A–1D are diagramatical views illustrating a crystal forming process utilizing selective nucleation. This process was proposed by the present applicant.
Figure 1B:
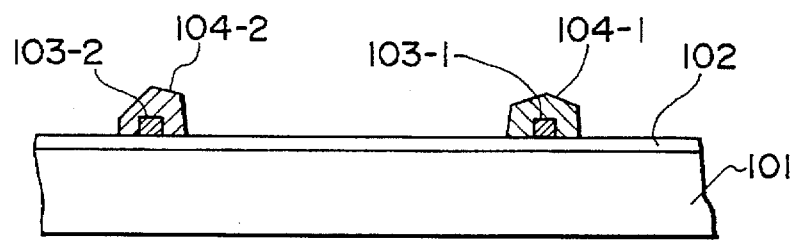
Figure 1C:
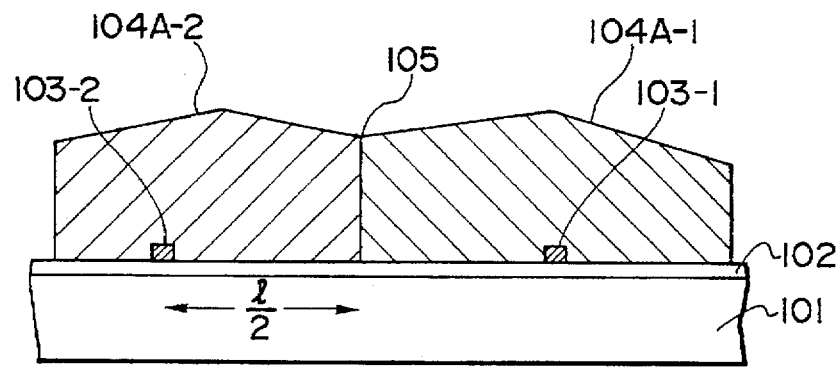
Figure 1D:
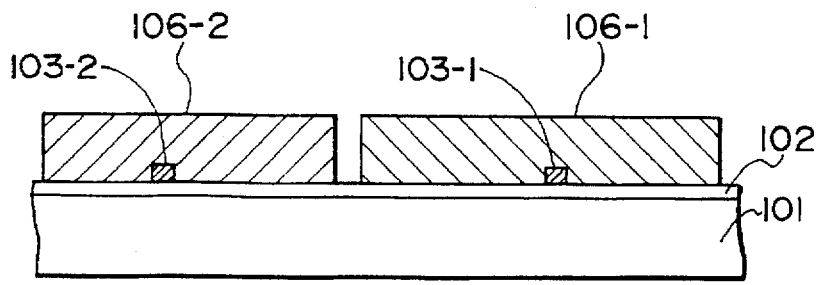

In a preferred embodiment of the present invention, the material constituting a nonnucleation surface is deposited to a thickness of several hundreds angstrom units or less, i.e. as a buffer layer (herein a layer functioning to alleviate the stress of interface), so as to reduce stress generated at the interface between the monocrystal and the nonnucleation surface during crystal growth where a monocrystal formed on a nucleation surface grows laterally over the nucleation surface (on the nonnucleation surface) and thereby suppress generation of defects in the monocrystal at the proximity of the interface.

The above function is considered to be given when the layer constituting the nonnucleation surface has a thickness of several hundreds angstrom units or less. Because, it is considered that in such a case, the layer is in a state easily causing structural change and some change actually occurs at the monocrystal growth temperature according to the monocrystal growth, thereby removing the cause for stress generated at the interface.

The buffer layer is preferably formed at a temperature lower than the crystal growth temperature, usually at a substrate temperature of 70°–450° C., more preferably at 100°–350° C., optimally 100°–300° C. The buffer layer formed at such a low temperature, for example, at a temperature lower than the crystal growth temperature by 100° C. or more, generates substantial thermal stress inside as heated to the crystal growth temperature. When a crystal is allowed to grow on the buffer layer under a state containing large thermal stress, the buffer layer causes structural change in the course of crystal growth. As a result, generation of stress at the interface between the monocrystal and the buffer layer is reduced and thereby generation of defect in the monocrystal at the proximity of the interface is suppressed.

If the buffer layer is thick (e.g. 1000 Å), structural change is prevented from extending smoothly over the whole film region and stress often remains at the lower surface of the crystal. Since the remaining stress is a cause of defect generation, buffer layer should be usually 500 Å or less, more preferably 200 Å or less, optimally 60 Å or less. The lower limit may be preferably 20 Å, more preferably 40 Å. The thickness of the buffer layer is thus determined preferably within the range between the above upper and lower limits depending on the material constituting the buffer layer, the condition of forming the buffer layer, the kind of crystal, the condition of forming the crystal, etc. In the present invention, the buffer layer thickness is preferably 20–200 Å, more preferably 40–60 Å.

As a method for forming a buffer layer, an unequilibrating method leaving thermal stress is desirably employed. For example, vapor deposition, the molecular beam epitaxial growth method, the low temperature MOCVD method, the plasma deposition method, etc. effectively generate thermal stress in a buffer layer, thus being practically preferable. On the contrary, the high temperature CVD method, the LPE method (liquid phase growth method), etc. require appropriate modification but is not unemployable in the present invention.

Further, the buffer layer must have a property functioning as a nonnucleation surface as well as functioning for reduction of stress generation in a crystal. The buffer layer should preferably be constituted of a material of which surface is lower in nucleation density by $10^3/cm^2$ or more as compared to the nucleation surface. As a preferred material meeting the above requirement, $SiO_2$ by the sputtering method and silicon nitride by the plasma CVD method may be employed, but the material is not limited to these materials, and those materials functioning to reduce generation of stress can also be employed.

The nucleation surface has a sufficiently small area to allow crystal growth from a single nucleus. Specifically, the area is preferably 16 $\mu m^2$ or less, more preferably 4 $\mu m^2$ or less, optimally 1 $\mu m^2$ or less.

In addition, the nucleation density of the nucleation surface must be larger than that of the nonnucleation surface, and the material constituting the nucleation surface should preferably be amorphous.

The present invention is described below specifically by referring to examples.

EXAMPLE 1

FIGS. 2A–2E illustrate diagramatically the steps of the process for forming silicon crystals of low defect density by utilizing the selective nucleation according to the present invention.

(Step A)

Figure 2A:
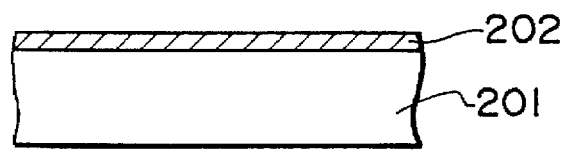
FIGS. 2A–2E are diagramatical views illustrating a silicon crystal forming process utilizing selective nucleation with employing a buffer layer.

On a high melting point glass support 201 was deposited a thin film 202 of amorphous $Si_3N_4$ to a thickness of 1500 Å by the LPCVD method as a material of high nucleation density enabling the selective nucleation (FIG. 2A).

(Step B)

Figure 2B:
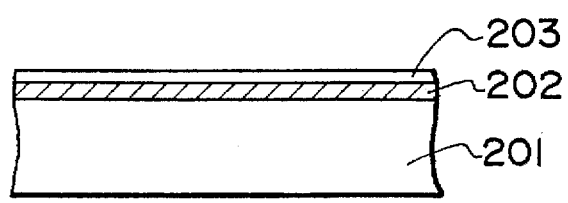

On the $Si_3N_4$ film formed was deposited an $SiO_2$ film 203 to a thickness of about 50 Å by the sputtering method (FIG. 2B). The substrate temperature during deposition was maintained at 300° C.

(Step C)

Figure 2C:
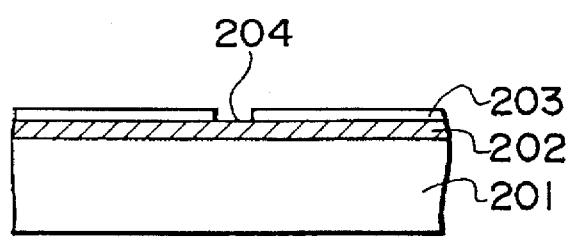

A window 204 of 1 μm square was opened in the $SiO_2$ film 203 to expose a part of the $Si_3N_4$ film, thus forming a seed for selective nucleation by the conventional photolithography technique (FIG. 2C).

(Step D)

Figure 2D:
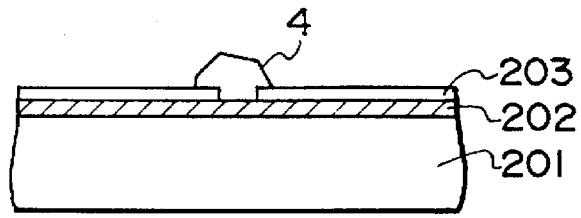

Next, HCl gas was allowed to flow on the surface of the substrate (i.e. support 201, $Si_3N_4$ layer 202 and $SiO_2$ layer 203 with windows 204) maintained at a temperature as high as 970° C. to clean the substrate surface. Then, $H_2$, $SiH_2Cl_2$ and HCl were supplied at a mole ratio of 100:1.2:1.6 to thereby form a silicon monocrystal island 4 under the reaction pressure of 105 Torr and the substrate temperature of 920° C. (FIG. 2D). During this step, the $SiO_2$ thin film 203 as deposited at a low temperature functions continuously to alleviate stress generated in the course of silicon crystal growth.

(Step E)

Figure 2E:
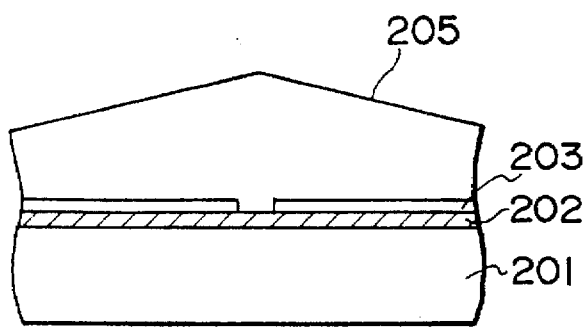

Crystal growth in Step D was continued for a desired duration to allow the monocrystal island 4 to grow larger and eventually become a polycrystal 205 of a desired grain size (FIG. 2E).

Evaluation of the polycrystal was performed as follows. End face portion of the grown polycrystal 205 was polished and subjected to a defect-visualizing etching (so-called Secco etching). The subsequent SEM observation indicated that the above-formed polycrystal had crystal defects extremely lower in the density and magnitude thereof at the proximity of crystal end face as compared with a silicon polycrystal formed without interposing a thin buffer layer on an $SiO_2$ film which is formed to have a thickness of 1500 Å by the CVD method.

EXAMPLE 2

This example shows that the dependency of the number of defects at the proximity of crystal end face upon the thickness of buffer layer was confirmed experimentally.

Figure 3:
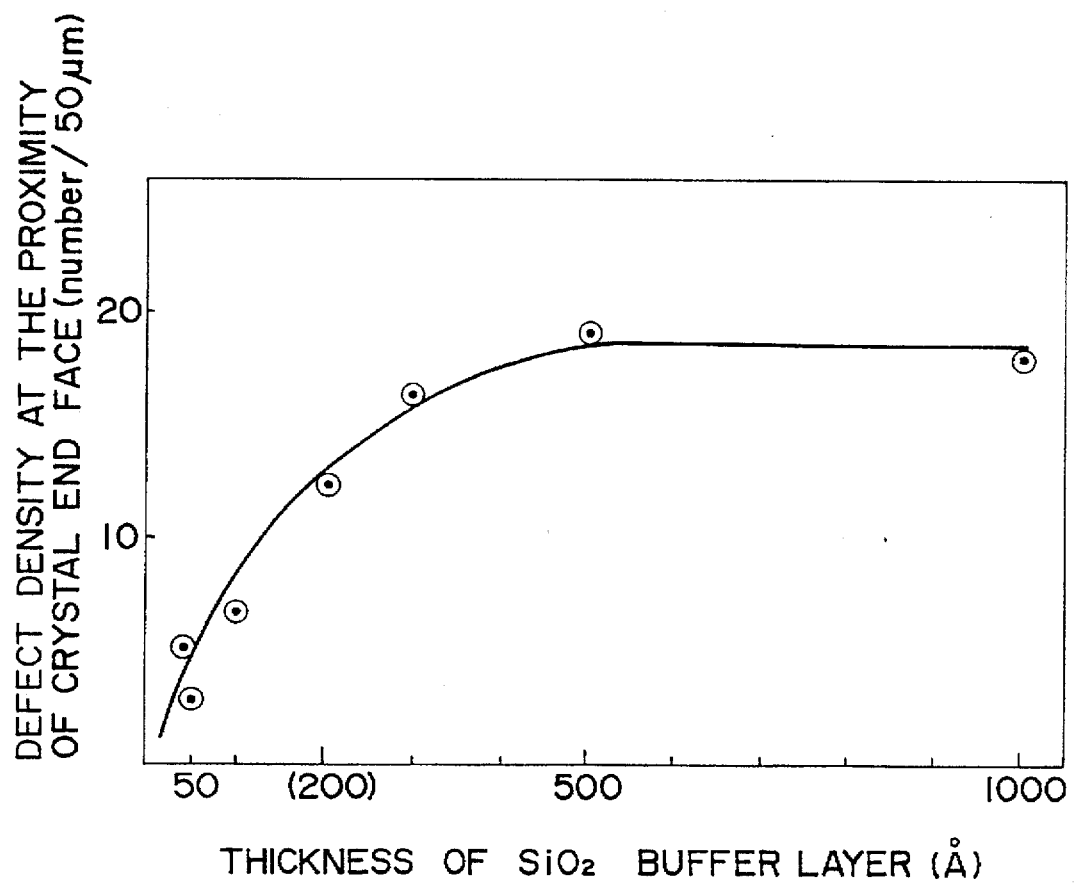
FIG. 3 is a graph showing the relation between the thickness of buffer layer and the defect density of interface.

FIG. 3 is a graph showing the relation between the thickness of a buffer layer and the defect density at the proximity of crystal end face of an Si monocrystal island grown on the buffer layer. The defect density was determined by polishing the end face portion with diamond paste, then subjecting the polished surface to etching for 90 seconds with an etching liquid prepared by diluting to double the Secco etching liquid with water to visualize the defects, and subsequently observing the defects with the use of a SEM. Defects crossing a segment of 50 μm parallel to the polished surface by 1 μm were counted to obtain the defect density.

Conditions of preparing the buffer layer and the Si crystal (High melting point glass supports were employed for each support for buffer layer formation) are shown below.

(1) Conditions for Forming an $SiO_2$ buffer layer

RF sputtering method

Substrate temperature: 250° C.

Pressure: 6 mTorr

Use gas: Ar, $O_2$

Mole ratio: $Ar:O_2=2:3$

RF power: 1.0 W/cm²

(2) Conditions for Forming an Si monocrystal

CVD method

Substrate temperature: 920° C.

Pressure: 150 Torr

Use gas: $SiH_2Cl_2$, HCl, $H_2$

Mole ratio: $SiH_2Cl_2:HCl:H_2=0.6:1.0:100$

As shown in FIG. 3, when the thickness of buffer layer decreases to 500 Å or less, the number of defect decreases suddenly and this tendency is accelerated with the decrease of buffer layer thickness.

EXAMPLE 3

This example illustrates a process for growing GaAs crystals of low defect density according to the crystal forming process utilizing selective nucleation of the present invention by referring to FIGS. 4A–4D.

(Step A)

Figure 4A:
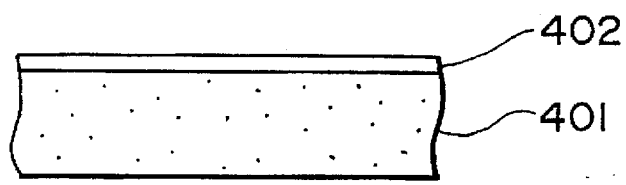
FIGS. 4A–4D are diagramatical views illustrating another crystal forming process utilizing selective nucleation with employing a buffer layer.
Figure 4B:
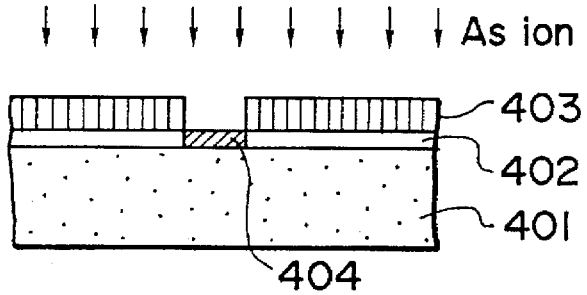

On a silicon wafer substrate 401 was deposited an amorphous silicon nitride film 402 to a thickness of 60 Å as a buffer layer by the plasma CVD method using $SiH_4$ and $NH_3$ as starting material gases (FIG. 4A). Mole ratio of $SiH_4$ to $NH_3$ supplied was 1:1, reaction pressure was 0.15 Torr and RF power (13,56 MHz) was $1.6 \times 10^{-2}$ W/cm².

(Step B)

After patterning with photoresist 403 (OSPR 800, supplied by Tokyo Oka K.K.), As ions were implanted to the silicon nitride layer 402 by using an ion implanter (cs 3000 mfd. by VARIAN (FIG. 4B)). Implanted amount was $3 \times 10^{15}$/cm². Thus, amorphous nucleation surfaces 404 were formed. The ion implanted areas were 1 μm square and the interval thereof was 10 μm. (Although FIGS. 4A–4D depict "one" nucleation surface 404, the actual number thereof was 10×10.)

(Step C)

Figure 4C:
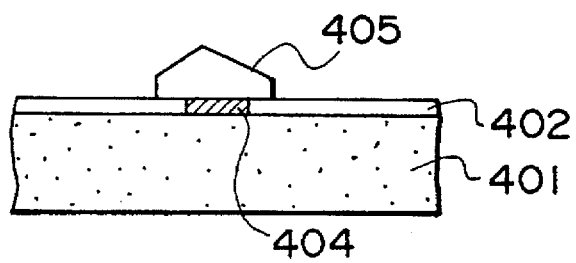

Photoresist 403 was then removed, and the substrate (i.e. support 401 and buffer layer 402 provided with nucleation surface 404) was thermally treated for 10 minutes at about 900° C. under $H_2$ atmosphere to clean the surface. Subsequently, while the substrate was heated at 650° C., trimethyl gallium (TMG) and arsine ($AsH_3$) were allowed to flow on the substrate surface at a mole ratio of 1:60 together with $H_2$ as a carrier gas, thereby growing a GaAs film by the MOCVD (metal organic chemical vapor deposition) method. Reaction pressure employed was about 10 Torr. GaAs monocrystal islands grow only on the surfaces of As ion implanted portions 404, and no generation of GaAs monocrystal island was observed on the other surface portions (FIG. 4C).

(Step D)

Figure 4D:
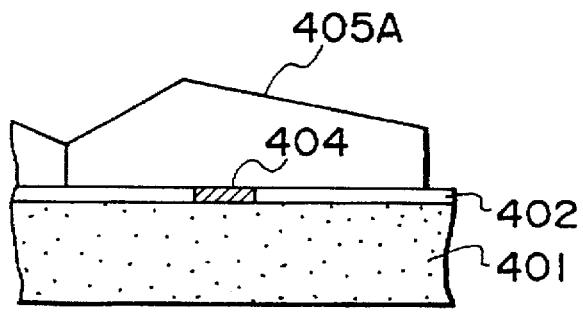

After five hours growth, GaAs monocrystal island 405 became as large as contacting with the adjacent GaAs monocrystals (FIG. 4D; 405A). The SEM observation as in EXAMPLE 2 indicated no defect generation.

Though illustrated above in detail, the present invention is not limited to the examples and includes various combinations of buffer layer (or second layer) condition, buffer layer forming condition and monocrystal forming condition.

As above, the present invention provides novel and effective means for solving the problem involved in the monocrystal forming process utilizing the difference of nucleation density and makes a great contribution toward the monocrystal formation technology.

I claim:

1. A method for suppressing the generation of defects in a monocrystal which defects tend to form in applying crystal forming treatment to a substrate, comprising:

(a) minimizing generation of stress during said crystal forming treatment by providing a substrate having a surface which is divided into a nonnucleation surface subject to thermal stress at an interface with a growing monocrystal and a nucleation surface having a sufficiently small area so as to form only a single nucleus from which said monocrystal is grown and having a larger nucleation density than the nucleation density of said nonnucleation surface and said nonnucleation surface being a buffer layer sufficient to minimize the generation of thermal stress during a crystal forming step and having a thickness of at most 500 Å, wherein the surface of said buffer layer is constituted of a material having a nucleation density smaller by at least $10^3/cm^2$ than the nucleation density of said nucleation surface;

(b) forming by vapor deposition a single nucleus on said nucleation surface; and (c) growing said monocrystal from said single nucleus by vapor deposition whereby said buffer layer causes structural change during the growing of said monocrystal and reduces generation of stress at the interface with said growing monocrystal.

2. A method of forming a crystal as defined in claim 1, wherein said buffer layer is formed at a substrate temperature of 450° C. or lower.

3. A method of forming a crystal as defined in claim 2, wherein said buffer layer is constituted of an oxide or a nitride.

4. A method of forming a crystal as defined in claim 3, wherein the thickness of said buffer layer is 200 Å or less.

5. A method of forming a crystal as defined in claim 1, wherein said buffer layer is formed within a temperature range of lower than the substrate temperature during said crystal forming treatment by 100° C. or more but not lower than 70° C.

6. A method of forming a crystal as defined in claim 1, wherein said buffer layer is constituted of either of an oxide and a nitride and has a thickness of 200 Å or less.

7. A method of forming a crystal as defined in claim 1, wherein said buffer layer is constituted of either of an oxide and a nitride and causes structural change at the temperature of crystal forming treatment.

8. A method of forming a crystal as defined in claim 1, wherein said buffer layer is constituted of either of an oxide and a nitirde and is formed within a temperature range of lower than the substrate temperature during said crystal forming treatment by 100° C. or more but not lower than 70° C.

9. A method of forming a crystal as defined in claim 1, wherein said buffer layer is formed at 450° C. or lower and causes structural change at the temperature of crystal forming treatment.

10. A method of forming a crystal as defined in claim 1, wherein said buffer layer is formed at 450° C. or lower and has a thickness of 200 Å or less.

11. A method for suppressing the generating of defects in a monocrystal, which defects tend to form in applying crystal forming treatment to a body, comprising:

(a) minimizing generation of stress along said crystal forming treatment by providing a body comprising a support; forming a first layer of an amorphous material on the surface of said support; and forming a second layer subject to thermal stress at an interface with a growing monocrystal on the surface of said first layer thereby exposing an area of said first layer sufficiently small so as to form only a single nucleus from which said monocrystal is grown, said second layer being a buffer layer having a surface with a smaller nucleation density than said first layer and having a layer thickness of at most 500 Å, wherein the surface of said buffer layer is constituted of a material having a nucleation density smaller by at least $10^3/cm^2$ than the nucleation density of said first layer;

(b) forming by vapor deposition said single nucleus in said first layer utilizing the difference of nucleation density between said first and second layers; and (c) growing said monocrystal from said single nucleus on the exposed area of said first layer and onto the surface of said second layer by vapor deposition, whereby said buffer layer causes structural change during the growing of said monocrystal and reduces generation of stress at the interface with said growing monocrystal.

* * * * *

UNITED STATES PATENT AND TRADEMARK OFFICE
CERTIFICATE OF CORRECTION

PATENT NO. : 5,690,736

DATED : November 25, 1997

INVENTOR(S): HIROYUKI TOKUNAGA

It is certified that error appears in the above-identified patent and that said Letters Patent is hereby corrected as shown below:

COLUMN 1

Line 21, "devices optical" should read --devices, optical--.

COLUMN 2

Line 56, "diagramatical" should read --diagrammatical--;
Line 59, "diagramatical" should read --diagrammatical--;
Line 65, "diagramatical" should read --diagrammatical--;

COLUMN 3

Line 58, "is" should read --are--.

COLUMN 4

Line 17, "diagramatically" should read --diagrammatically--.

COLUMN 5

Line 48, "(13,56 MHz)" should read --(13.56 MHz)--.

UNITED STATES PATENT AND TRADEMARK OFFICE
CERTIFICATE OF CORRECTION

PATENT NO. : 5,690,736

DATED : November 25, 1997

INVENTOR(S): HIROYUKI TOKUNAGA

It is certified that error appears in the above-identified patent and that said Letters Patent is hereby corrected as shown below:

<u>COLUMN 7</u>

Line 14, "generating" should read --generation--.

Signed and Sealed this

Twenty-first Day of April, 1998

Attest:

BRUCE LEHMAN

*Attesting Officer*     *Commissioner of Patents and Trademarks*